(12) United States Patent
Kinsman et al.

(10) Patent No.: US 10,490,588 B2
(45) Date of Patent: Nov. 26, 2019

(54) METHODS AND APPARATUS FOR A THERMAL EQUALIZER IN AN IMAGE SENSOR

(71) Applicant: SEMICONDUCTOR COMPONENTS INDUSTRIES, LLC, Phoenix, AZ (US)

(72) Inventors: Larry Duane Kinsman, Boise, ID (US); Swarnal Borthakur, Boise, ID (US); Marc Allen Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 199 days.

(21) Appl. No.: 15/268,183

(22) Filed: Sep. 16, 2016

(65) Prior Publication Data

US 2018/0083058 A1     Mar. 22, 2018

(51) Int. Cl.
| | |
|---|---|
| *H01L 27/00* | (2006.01) |
| *H01L 27/146* | (2006.01) |
| *H01L 31/0203* | (2014.01) |
| *H01L 21/56* | (2006.01) |
| *H01L 23/373* | (2006.01) |
| *H01L 31/024* | (2014.01) |

(52) U.S. Cl.
CPC ...... *H01L 27/14634* (2013.01); *H01L 21/563* (2013.01); *H01L 23/373* (2013.01); *H01L 23/3732* (2013.01); *H01L 27/1462* (2013.01); *H01L 27/1469* (2013.01); *H01L 27/14601* (2013.01); *H01L 27/14636* (2013.01); *H01L 31/0203* (2013.01); *H01L 31/024* (2013.01)

(58) Field of Classification Search
CPC .......... H01L 27/14601; H01L 27/1462; H01L 27/14634; H01L 27/14636; H01L 27/1469; H01L 31/0203; H01L 31/024; H01L 2225/06589; H01L 21/563; H01L 23/373; H01L 23/3732
See application file for complete search history.

(56) References Cited

U.S. PATENT DOCUMENTS

| | | | |
|---|---|---|---|
| 2002/0113288 A1 | 8/2002 | Clevenger | |
| 2006/0091290 A1* | 5/2006 | Yoshihara | H01L 27/14618 250/208.1 |
| 2006/0113546 A1* | 6/2006 | Sung | C23C 16/274 257/77 |
| 2010/0140790 A1 | 6/2010 | Setiadi | |
| 2014/0085829 A1* | 3/2014 | Yamashita | H05K 1/0204 361/717 |
| 2014/0264723 A1 | 9/2014 | Liang | |

* cited by examiner

*Primary Examiner* — Minh Loan Tran
(74) *Attorney, Agent, or Firm* — The Noblitt Group, PLLC; Hettie L. Haines

(57) ABSTRACT

Various embodiments of the present technology may comprise a method and apparatus for an image sensor with a thermal equalizer for distributing heat. The method and apparatus may comprise a thermal equalizer disposed between a sensor die and a circuit die to prevent uneven heating of the pixels in the sensor die. The method and apparatus may comprise a thermal equalizer integrated within the circuit die.

12 Claims, 8 Drawing Sheets

Figure 1:
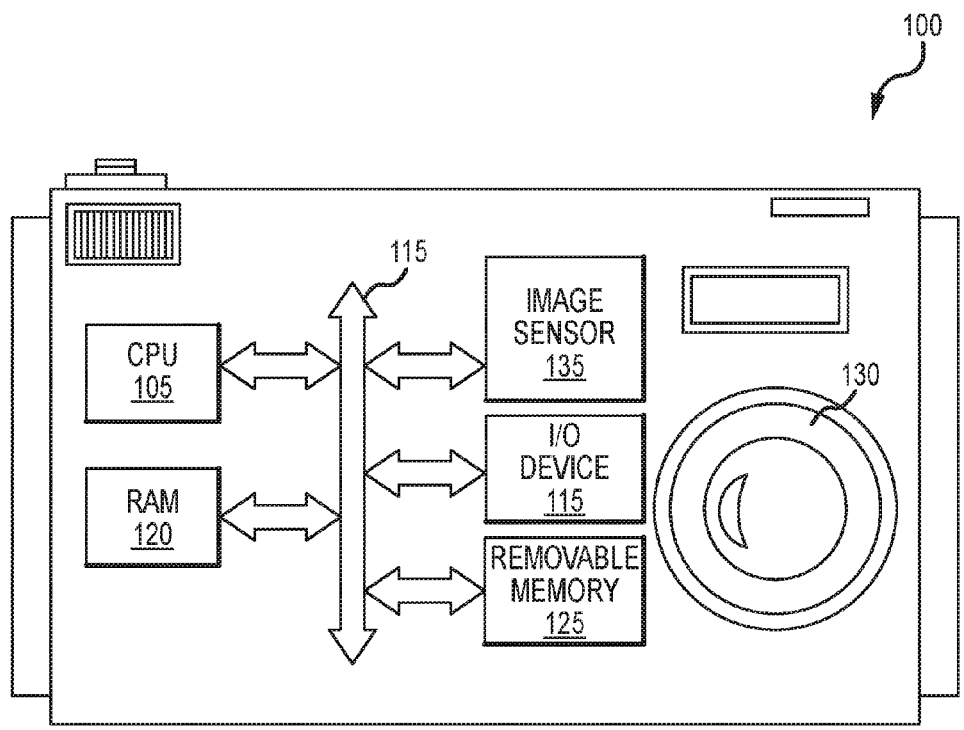

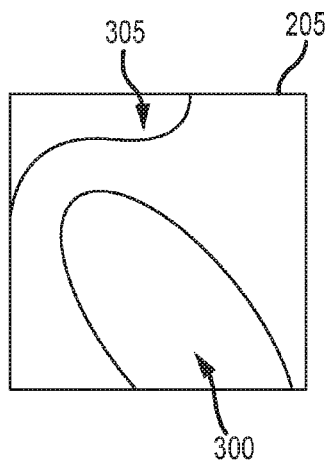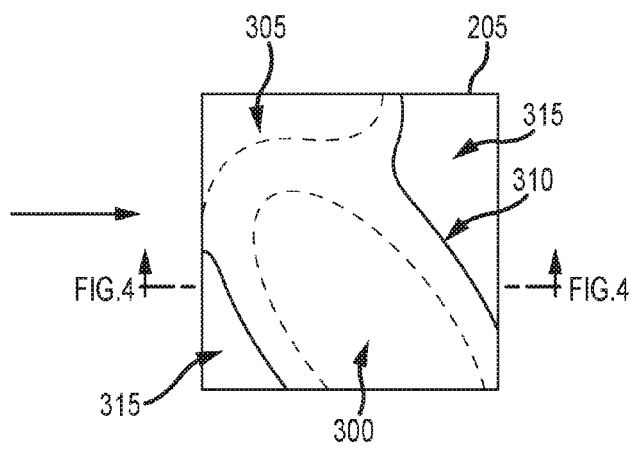
FIG.3A  FIG.3B
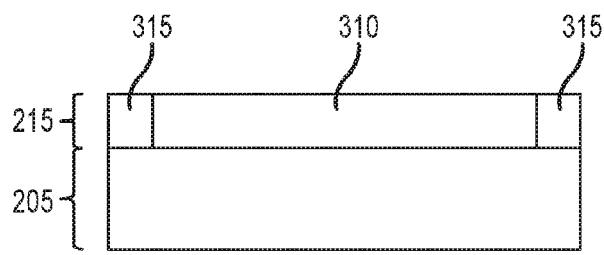
FIG.4

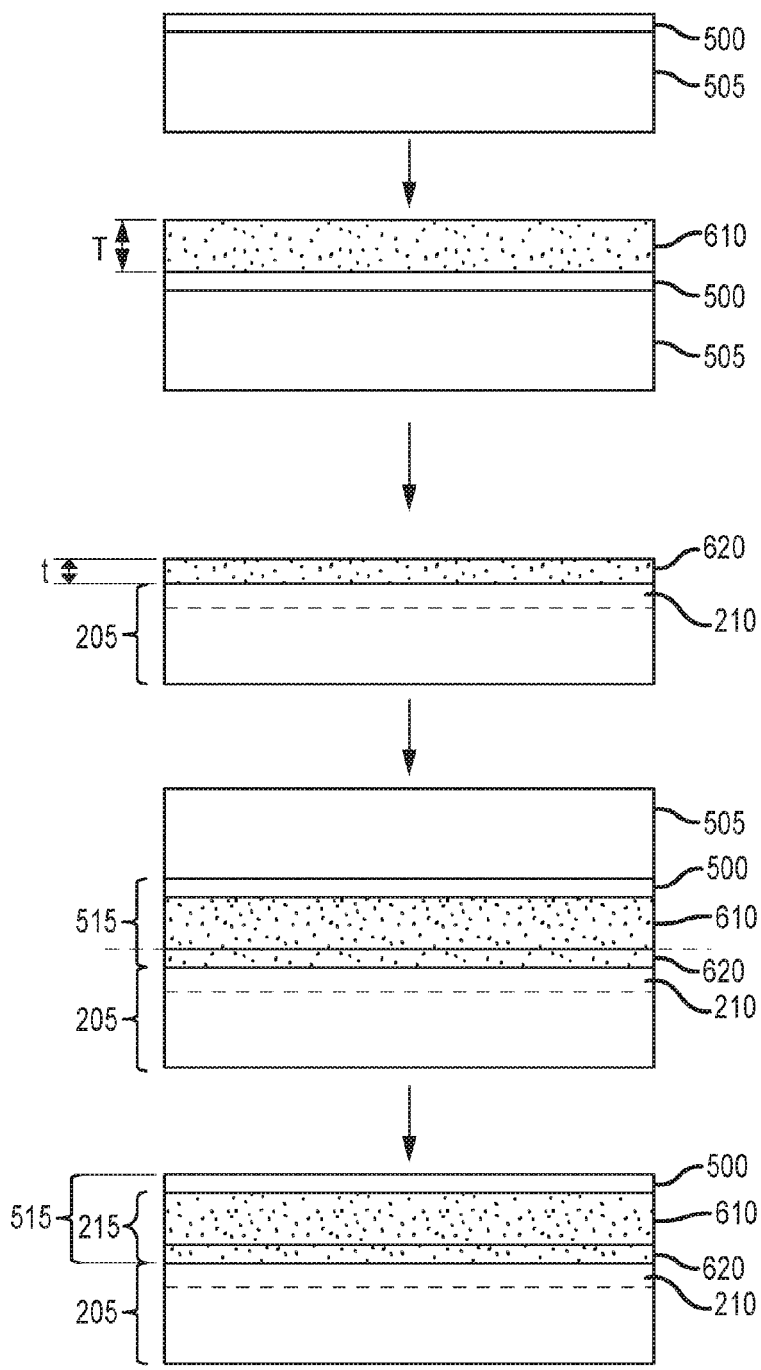

METHODS AND APPARATUS FOR A THERMAL EQUALIZER IN AN IMAGE SENSOR

BACKGROUND OF THE TECHNOLOGY

Image sensors used in cell phone cameras, web cameras, and the like, may be implemented in a vertically stacked orientation, wherein a sensor die comprising the photosensitive element is stacked atop a circuitry die, which comprises processing and readout circuitry. Stacked or vertically integrated image sensors allow for larger photosensitive areas, which improves image quality, while maintaining a small footprint. Due to uneven power distribution, however, the circuitry die may experience thermal gradients across the die. Thermal gradients transferred to the sensor die may affect various temperature-dependent operating characteristics of the sensor die. For example, pixels exposed to increased temperatures may exhibit an increase of dark current, thereby reducing the signal-to-noise ratio. The non-uniform pixel response due to the thermal gradient across the pixel array may create image artifacts, such as image shading defects.

Electrically connecting the two dies may be achieved by etching vias, which are then filled with metal to form electrical interconnects, or by providing a metal-to-metal hybrid bond below the image sensor array. Conventional heat sinks formed from metal cannot be used in stacked implementations because, unless each interconnect is separated from the heat sink by a dielectric passivation, the metal heat sink would short the electrical interconnects. In applications where interconnects are under the pixel array, isolating each interconnect with a dielectric passivation will not completely remove the thermal gradient across the pixel array. In addition, in applications where interconnects are outside the pixel array, isolating each interconnect with a dielectric passivation will not completely remove the thermal gradient around the pixel array periphery.

SUMMARY OF THE INVENTION

Various embodiments of the present technology may comprise a method and apparatus for an image sensor with a thermal equalizer for distributing heat. The method and apparatus may comprise a thermal equalizer disposed between a sensor die and a circuit die to reduce or prevent uneven heating of the pixels in the sensor die. The method and apparatus may comprise a thermal equalizer integrated within the circuit die.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 2:
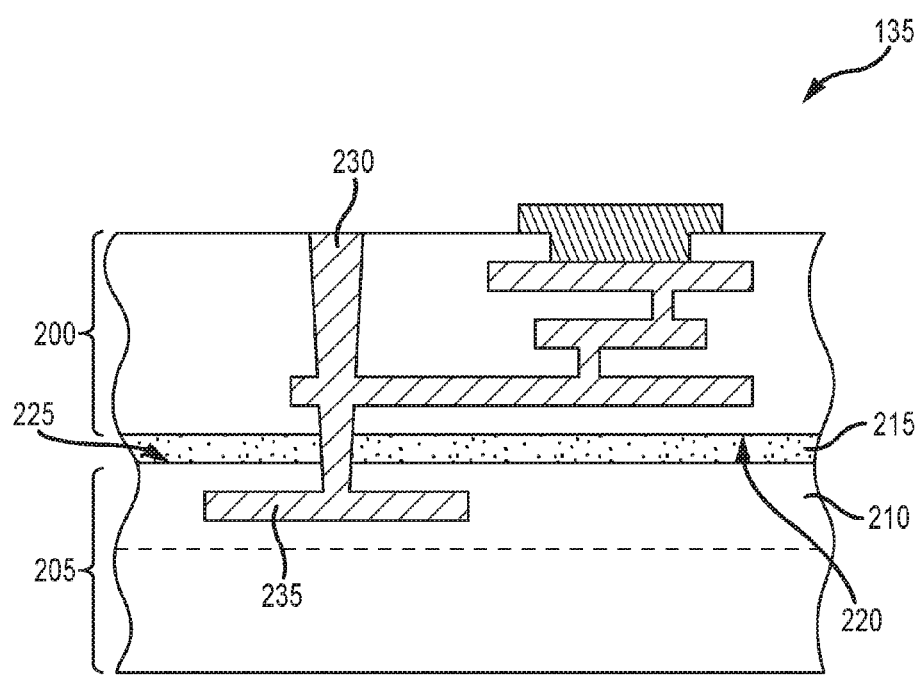
Figure 8A:
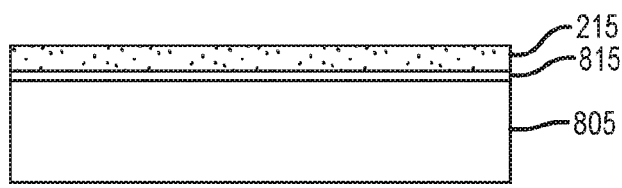
Figure 8B:
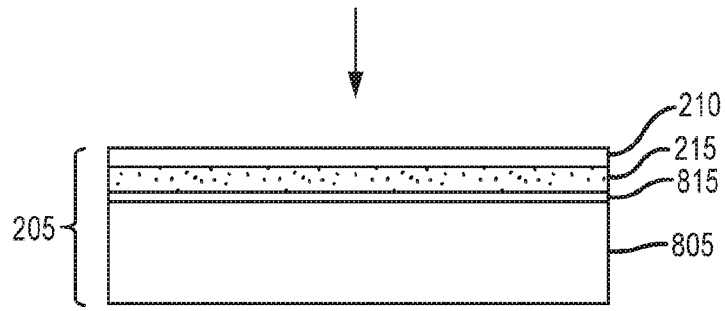

FIG. 1 representatively illustrates an imaging system in accordance with an exemplary embodiment of the present technology;

FIG. 2 representatively illustrates an image sensor in accordance with an exemplary embodiment of the present technology;

FIGS. 3A-B representatively illustrate a patterned thermal equalizer in accordance with an exemplary embodiment of the present technology;

FIG. 4 representatively illustrates a cross-sectional view of a patterned thermal equalizer in accordance with an exemplary embodiment of the present technology;

FIGS. 5A-D representatively illustrate a process for forming a thermal equalizer in accordance with an exemplary embodiment of the present technology;

FIGS. 6A-E representatively illustrate a process for forming a thermal equalizer in accordance with an exemplary embodiment of the present technology;

FIGS. 7A-E representatively illustrate a process for forming a thermal equalizer in accordance with an exemplary embodiment of the present technology;

FIGS. 8A-B representatively illustrate a process for forming an integrated circuit die in accordance with an exemplary embodiment of the present technology; and FIGS. 9A-D representatively illustrate a process for forming an integrated circuit die in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various image sensors, image processing units, and the like, which may carry out a variety of functions. In addition, the present technology may be practiced in conjunction with any number of systems, such as automotive, aerospace, and consumer electronics, and the systems described are merely exemplary applications for the technology. Further, the present technology may employ any number of conventional techniques for capturing image data, sampling image data, readout of image data, and the like.

Methods and apparatus for a thermal equalizer according to various aspects of the present technology may be utilized in conjunction with any suitable system, where thermal distribution may be beneficial. Further, methods and apparatus for the thermal equalizer may be utilized with any suitable imaging system, such as a camera system, video system, machine vision, vehicle navigation, surveillance system, motion detection system, and the like.

Referring to FIG. 1, an exemplary imaging system may comprise an electronic device, such as a digital camera 100. In one embodiment, the imaging system may comprise a central processing unit (CPU) 105 that communicates with various devices over a bus 110. Some of the devices connected to the bus 110 may provide communication into and out of the system, for example an input/output (I/O) device 115. Other devices connected to the bus 110 provide memory, for example a random access memory (RAM) 120, hard drive, and one or more peripheral memory devices 125, such as a USB drive, memory card, and SD card. While the bus 110 is illustrated as a single bus, any number of busses may be used to provide communication paths to interconnect the devices.

The imaging system may further comprise an image sensor 135 for capturing image data. For example, light may enter the imaging system through a lens 130 and strike the image sensor 135. In various embodiments, the lens 130 may be configured to focus an image. For example the lens 130 may include a fixed and/or adjustable lens.

The image sensor 135 may detect and convey the information that constitutes an image, for example, by converting the variable attenuation of waves (as they pass through or reflect off object) into electrical signals. The image sensor 135 may be implemented in conjunction with any appropriate technology, such as active pixel sensors in complementary metal-oxide-semiconductors (CMOS), N-type metal-oxide-semiconductors (NMOS), analog sensors, and/or flat panel detectors.

Referring to FIG. 2, the image sensor 135 may comprise a sensor die 200 electrically coupled to an integrated circuit die 205, wherein the dies 200, 205 are stacked vertically, such that a first major surface 220 of the sensor die 200 and a second major surface 225 of the integrated circuit die 205 are adjacent or proximate each other in the vertical stack.

The sensor die 200 may comprise an array of photosensitive elements (not shown) arranged in rows and columns. The photosensitive elements operate by converting light into an electric charge and may comprise, for example, a photodiode, a photogate, or any other device responsive to light. In various embodiments, the image sensor 135 may comprise a color filter array (not shown) disposed on a surface of the sensor die 200 to filter impinging light according to wavelength.

In various embodiments, the image sensor 135 may further comprise a microlens array (not shown) formed by a plurality of microlenses disposed on a surface of the sensor die 200 to help focus light on the photosensitive elements. The size and type of the microlenses may be selected for a particular application, and may be formed using conventional fabrication techniques and methods.

The integrated circuit die 205 may be configured to perform various processing and readout operations. For example, the integrated circuit die 205 may comprise a microprocessor, an application-specific integrated circuit (ASIC), or the like. In various embodiments, the integrated circuit die 205 may comprise row circuitry, column circuitry, and a timing and control unit, for selectively activating sequential readout of electrical signals. The integrated circuit die 205 may comprise an image signal processor to perform various signal processing functions, such as demosaicing, autofocus, noise reduction, white balance, and the like. The integrated circuit die 205 may comprise any number of devices, such as transistors, capacitors, and like for performing calculations, transmitting and receiving image data, and a storage unit for storing image data.

In an exemplary embodiment, the integrated circuit die 205 may comprise an integrated circuit region 210 comprising various metal layers 235 to provide electrical interconnects between the various operating and processing circuitry. The integrated circuit region 210 may also comprise a passivation layer (not shown) that may be suitably configured to protect the integrated circuit die 205 from corrosion. In various embodiments, the integrated circuit region 210 may be adjacent to the second major surface 225 of the integrated circuit die 205.

The image sensor 135 may further comprise a thermal equalizer 215 to reduce hot spots and to increase thermal uniformity across the image sensor 135 by distributing and/or dissipating heat generated by the integrated circuit die 205. In an exemplary embodiment, the thermal equalizer 215 may be disposed between the sensor die 200 and the integrated circuit die 205 to help facilitate heat transfer between the integrated circuit die 205 and the sensor die 200. The thermal equalizer 215 may comprise any suitable material having a high thermal conductivity and a low electrical conductivity (i.e., an electrical insulator), such as: nano-crystalline diamond (i.e., CVD diamond); boron arsenide; or the like. The thermal equalizer 215 may further comprise a material with low thermal conductivity, such as $SiO_2$ (e.g., 1-2 W/mK) or $Si_3N_4$ (e.g., 10-50 W/mK).

According to various embodiments, the thermal equalizer 215 may comprise one layer of the thermally conductive material. In alternative embodiments, however, the thermal equalizer 215 may comprise a plurality of layers of the thermally conductive material. In embodiments where the thermal equalizer 215 comprises multiple layers of thermally conductive material, each layer may be configured to exhibit different thermal properties. For example, one layer may comprise a material having a first thickness T and a second layer of the material having a second thickness t, where the first thickness T is greater than the second thickness t. As a result, the thicker layer (e.g., the layer with the first thickness T) will have a higher thermal conductivity than the thinner layer (e.g., the layer with the second thickness t).

In various embodiments, the thermal equalizer 215 may comprise multiple layers of CVD diamond, wherein each layer of nano-crystalline diamond may have different thicknesses. The thickness of each layer of nano-crystalline diamond is proportional to the temperature applied during the growth process, and higher temperatures (e.g., 700-900 degrees Celsius) will yield a higher growth rate, and thus thicker layers. As such, thicker layers may be grown (deposited) on materials that can withstand high temperatures, such as silicon, tungsten, molybdenum, silicon carbide, silicon nitride, quartz glass, cemented carbide, and the like. Thin layers of CVD diamond may be grown at lower temperatures on substrates comprising components that are prone to failure and/or destruction if exposed to the high temperatures necessary to form thick layers. For example, high temperatures may melt metal layers formed in the substrate, and/or may cause uneven doping distribution of photodiodes formed in the substrate. Due to the physical properties of the nano-crystalline diamond, the thicker layers may exhibit larger crystalline grain structures. As such, a thicker layer will also have a higher thermal conductivity than the thinner layers.

Referring to FIGS. 3A-B and 4, in various embodiments, one layer of the thermal equalizer 215 may comprise multiple thermally conductive materials that are specifically patterned to distribute heat from one area of the integrated circuit die 205 to another area. For example, the integrated circuit die 205 may exhibit a first area 300 subject to higher relative temperatures (e.g., a maximum temperature) and a second area 305 subject to lower relative temperatures (e.g., a minimum temperature). A first thermally conductive material with a high thermal conductivity 310 may be patterned to cover both the first area 300 and the second area 305 to help equalize a thermal gradient between the two areas. For example, the patterned first thermally conductive material may comprise a continuous layer that extends to cover both the first area 300 and the second area 305. Areas of the integrated circuit die 205 with temperatures in between the maximum and minimum temperature may be covered with a second thermally conductive material with a low thermal conductivity 315.

In various embodiments, and referring to FIG. 4, the first and second thermally conductive materials 310, 315 may form a layer such that the first and second thermally conductive materials 310, 315 are coplanar. For example, the layer may be formed by depositing the material with a low thermal conductivity 315 in a negative space left after patterning the material with a high thermal conductivity 310 or vice versa. In this way various thermally conductive materials may be specifically patterned to distribute the heat generated by a particular integrated circuit die 205 with a known thermal gradient in a more controlled manner. In alternative embodiments, the layer may comprise a single thermally conductive material that extends to the edges of the integrated circuit die 205.

Figure 5A:
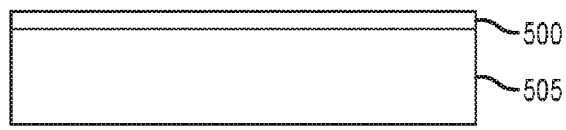
Figure 5B:
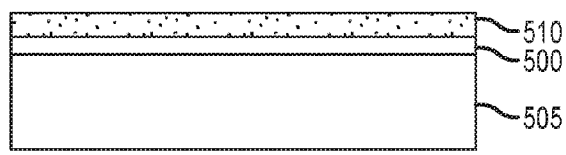
Figure 5C:
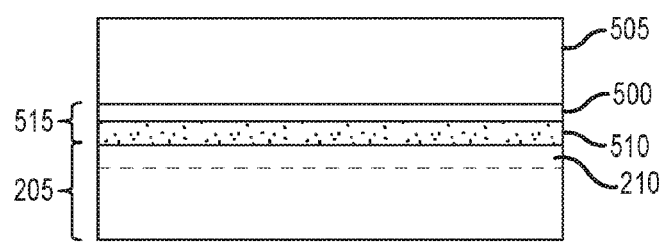
Figure 5D:

Referring to FIGS. 5A-D, an insulating region 515, comprising the thermal equalizer 215, may be formed by forming (e.g., growing by thermal oxidation) an insulating layer 500, for example silicon dioxide, on a sacrificial wafer 505 (FIG. 5A). A thermally conductive layer 510 may then be deposited on the insulating layer 500 (FIG. 5B). The sacrificial wafer comprising the insulating layer 500 and thermally conductive layer 510 are then bonded to the integrated circuit die 205, with the thermally conductive layer 510 being bonded to the integrated circuit die 205 (FIG. 5C). In the present embodiment, the insulating region 515 may comprise the thermal equalizer 215 and the insulating layer 500, wherein the thermal equalizer 215 includes only one thermally conductive layer 510. After bonding, the sacrificial wafer 505 may be removed (FIG. 5D) and the major surface 220 of the sensor die 200 may be positioned on the thermal equalizer 215.

Alternatively, and referring now to FIGS. 6A-E, the insulating region 515, comprising the thermal equalizer 215, may be formed by forming (e.g., growing by thermal oxidation) the insulating layer 500, for example silicon dioxide, on the sacrificial wafer 505 (FIG. 6A). A first thermally conductive layer 610 with a first thickness T and a first resistivity may then be deposited on the insulating layer 500 (FIG. 6B). A second thermally conductive layer 620 with a second thickness t with a second resistivity may be deposited on the integrated circuit die 205 (FIG. 6C). In the present embodiment, the first thickness T may be greater than the second thickness t such that the thermal conductivity of the first thermally conductive layer 610 will be greater than the thermal conductivity of the second thermally conductive layer 620.

The first thermally conductive layer 610 may then be bonded to the second thermally conductive layer 620 (FIG. 6D). Since the same materials are bonded to each other, the bond between the first and second thermally conductive layers 610, 620 may be stronger than a bond between two different materials, for example the first thermally conductive layer 610 and the insulating layer 500.

According to the present embodiment, the insulating region 515 may comprise the thermal equalizer 215 and the insulating layer 500, wherein the thermal equalizer 215 comprises two thermally conductive layers 610, 620, each layer comprising different thermal properties. After bonding, the sacrificial wafer 505 may be removed (FIG. 6E) to allow the sensor die 200 to be positioned on the insulating layer 500, or directly on the thermal equalizer 215 in a case where the insulting layer 500 is absent.

Figure 7A:
Figure 7B:
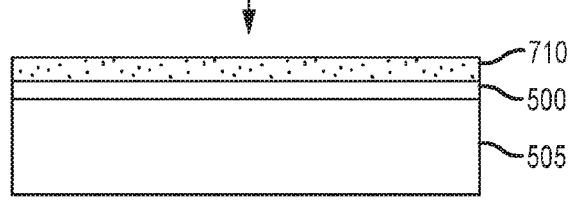
Figure 7C:
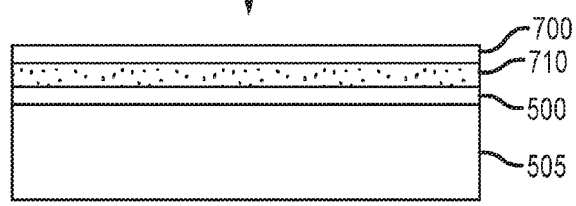
Figure 7D:
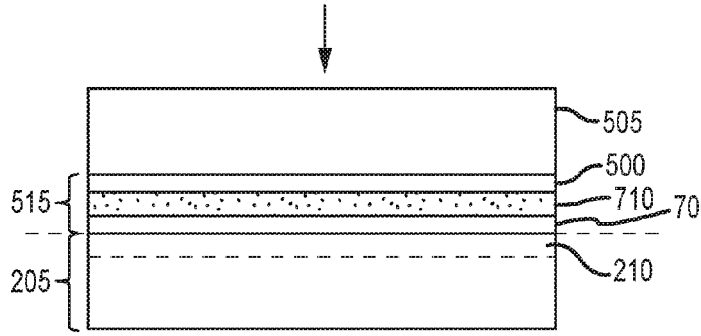
Figure 7E:
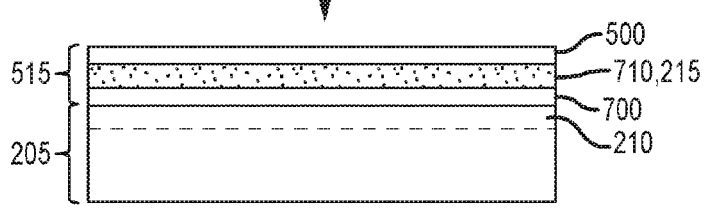

In yet another embodiment, referring now to FIGS. 7A-E, the insulating region 515, comprising the thermal equalizer 215, may be formed by forming (e.g., growing by thermal oxidation) a first insulating layer 500, for example silicon dioxide, on the sacrificial wafer 505 (FIG. 7A). A thermally conductive layer 710 may then be deposited on the insulating layer 500 (FIG. 7B). A second insulating layer 700 may be deposited on the thermally conductive layer 710 (FIG. 7C). The first and second insulating layers 500, 700 and the thermally conductive layer 710 are then bonded to the integrated circuit die 205, with the second insulating layer 700 being bonded to the integrated circuit die 205 (FIG. 7D). According to the present embodiment, the insulating region 515 may comprise the thermal equalizer 215, the first insulating layer 500, and the second insulating layer 700, wherein the thermal equalizer 215 includes only one thermally conductive layer 710. After bonding, the sacrificial wafer 505 may be removed (FIG. 7E) to allow the sensor die 200 to be positioned on the insulating layer 500 insulating layer 500, or directly on the thermal equalizer 215 in a case where the insulting layer 500 is absent.

In the foregoing, bonding may be achieved using any suitable bonding methods and techniques, for example temperature annealing, liquid-activation bonding, plasma-activated bonding, and the like. In addition, the bonding surfaces may be polished to provide smooth surfaces to increase the bond strength.

Referring again to FIG. 2, after the sacrificial wafer 505 has been removed and the sensor die 200 is positioned on and bonded to the thermal equalizer 215, the sensor die 200 may be electrically coupled to the integrated circuit die 205. In an exemplary embodiment, the sensor die 200 may be electrically coupled to the integrated circuit die 205 by a single damascene process or a dual damascene process where a trench and a via are etched (simultaneously in the dual damascene process) perpendicular to the major surface 220 of the sensor die 200 and the major surface 225 of the integrated circuit die 205. Alternatively, the trench and the via may be formed using any suitable process. It is understood that the via may be perpendicular or substantially perpendicular to the major surface 220 due to the properties of the materials of the sensor die 205 and the integrated circuit die 205, the chemical used to create the via, as well as variations in processing. For example, edges of the trench and/or via may be sloped.

In various embodiments, the via may extend through the sensor die 200 and thermal equalizer 215 and into the integrated circuit die 205. The via is then filled with a metal, for example copper, to provide an electrical interconnect 230 between the sensor die 200 and the integrated circuit die 205. As a result, a portion of the metal electrical interconnect 230 is surrounded by and abuts the thermal equalizer 215. According to various embodiments, the stacked image sensor 135 may comprise a plurality of electrical interconnects 230. Since the thermal equalizer 215 has a low electrical conductivity (i.e., electrical insulator), the electrical interconnects 230 are electrically isolated from each other and will not short on the thermal equalizer 215.

Referring to FIGS. 8A-B, in an exemplary embodiment, the thermal equalizer 215 may be formed prior to forming the integrated circuit region 210 of the integrated circuit die 205 to provide additional heat distribution. According to the present embodiment, the integrated circuit die 205 may be fabricated by forming an insulating layer 815, for example silicon dioxide, on an integrated circuit wafer 805. The thermal equalizer 215 may then be deposited on the insulating layer 815 (FIG. 8A). Finally, the integrated circuit region 210 comprising the metal layers, may be formed on the thermal equalizer 215 (FIG. 8B).

Figure 9A:
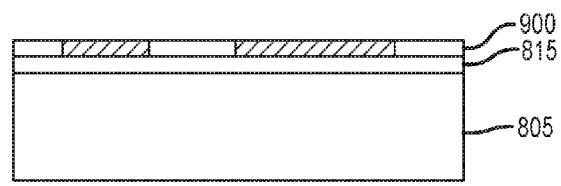
Figure 9B:
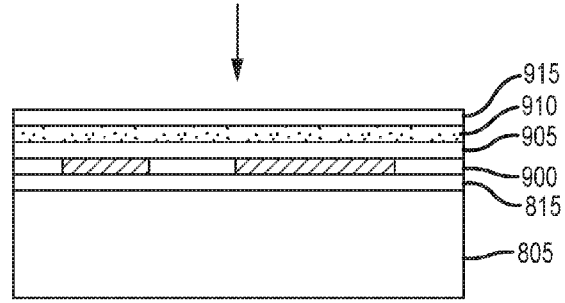
Figure 9C:
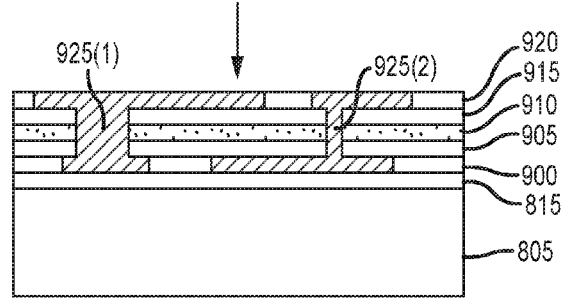
Figure 9D:
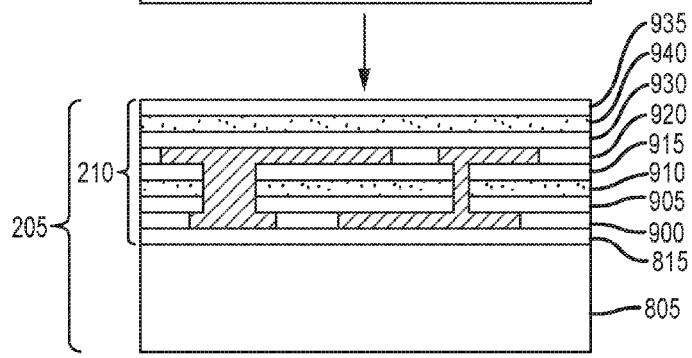

Referring to FIGS. 9A-D, in an alternative embodiment, the thermal equalizer 215 may be incorporated into the integrated circuit region 210 of the integrated circuit die 205 to provide additional heat distribution. According to the present embodiment, the integrated circuit die 205 may be fabricated by forming an insulating layer 815, for example silicon dioxide, on an integrated circuit wafer 805. The integrated circuit region 210 may be fabricated by forming a first metal layer 900 on the insulating layer 815 (FIG. 9A) and transferring a first thermally conductive layer 910 (i.e., the thermal equalizer 215) on the first metal layer 900 (FIG. 9B). Transferring the first thermally conductive layer 910 may also comprise transferring a first and second insulating layer 905, 915 with the thermally conductive layer 910, as described above using a sacrificial wafer 505. An electrical interconnect 925 may be formed to couple the first metal layer 900 to a second metal layer 920 (FIG. 9C). The electrical interconnect 925 may be formed by etching a trench and via using a damascene process and filling the trench and via to simultaneously form the second metal layer 920 and the electrical interconnect 925. In various embodiments, a plurality of electrical interconnects 925 may be formed within the integrated circuit region 210. Since the thermal equalizer 215 has a low electrical conductivity (i.e., electrical insulator), each electrical interconnect 925 is electrically isolated from another and will not short on the thermal equalizer 215.

A second thermally conductive layer 940 (i.e., the thermal equalizer 215) may then be transferred to the second metal layer 920 using the sacrificial wafer 505 as described above (FIG. 9D).

While the embodiments illustrated above describe a stacked image sensor 135 with two dies, the stacked image sensor 135 may comprise three or more dies, where the thermal equalizer 215 may be disposed between any two dies in the stack.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An image sensor, comprising:
   a first die comprising:
      a first major surface, and
      a plurality of photosensitive elements;
   a second die electrically coupled to the first die, wherein the second die comprises:
      a second major surface disposed adjacent to the first major surface; and
      processing circuitry;
   a first thermally conductive layer, having a first thermal conductivity, disposed between the first and second major surfaces, wherein the first thermally conductive layer comprises a continuous layer and is patterned to selectively distribute heat from a first area of the second die to a second area of the second die; and
   a plurality of electrical interconnects substantially perpendicular to the first and second major surfaces, wherein:
      a portion of each electrical interconnect is surrounded by and abuts the continuous first thermally conductive layer; and
      the electrical interconnects are electrically insulated from each other.

2. The image sensor of claim 1, wherein at least one of the electrical interconnects extends from the first die into the second die.

3. The image sensor of claim 1, further comprising a second thermally conductive layer, having a second thermal conductivity, coplanar with the first thermally conductive layer, and disposed in a negative space created by the patterned first thermally conductive layer.

4. The image sensor of claim 3, further comprising a third thermally conductive layer, having a third thermal conductivity, wherein the third thermally conductive layer is disposed between the first thermally conductive layer and at least one of the first and second major surfaces.

5. The image sensor of claim 4, wherein at least one of the first, second, and third thermally conductive layers comprises at least one of nano-crystalline diamond and boron arsenide.

6. The image sensor of claim 1, wherein the second die comprises a second thermally conductive layer integrated within the die.

7. The image sensor of claim 1, wherein the first thermally conductive layer is patterned according to a thermal gradient of the second die and extends to cover both the first area and the second area.

8. An imaging system, comprising:
an image sensor comprising:
  a first die comprising:
    a first major surface; and
    a plurality of photosensitive elements;
  a second die electrically coupled to the first die, wherein the second die comprises:
    a second major surface disposed adjacent to the first major surface; and
    processing circuitry;
  a first thermally conductive layer, having a first thermal conductivity, disposed between the first and second major surfaces; wherein the first thermally conductive layer is patterned according to a thermal gradient of the second die;
  a second thermally conductive layer, having a second thermal conductivity, disposed adjacent to the first thermally conductive layer and between the first and second major surfaces; and
  a plurality of electrical interconnects perpendicular to the first and second major surfaces, wherein:
    a portion of each electrical interconnect is surrounded by and abuts the first and second thermally conductive layers;
    at least one of the electrical interconnects extends from the first die into the second die; and
    the electrical interconnects are electrically insulated from each other;
  a central processing unit electrically coupled to the image sensor; and
  a memory device electrically coupled to the central processing unit.

9. The imaging system of claim 8, wherein the first thermally conductive layer is patterned to selectively distribute heat from a first area of the second die to a second area of the second die.

10. The imaging system of claim 8, further comprising a third thermally conductive layer, having a third thermal conductivity, coplanar with the first thermally conductive layer, and disposed in a negative space created by the patterned first thermally conductive layer.

11. The imaging system of claim 10, wherein the second die comprises a fourth thermally conductive layer integrated within the die.

12. The imaging system of claim 11, wherein at least one of the first, second, third and fourth thermally conductive layers comprises at least one of nano-crystalline diamond and boron arsenide.

\* \* \* \* \*